US009419248B2

(12) United States Patent
Nakamura

(10) Patent No.: US 9,419,248 B2
(45) Date of Patent: Aug. 16, 2016

(54) ORGANIC LED ELEMENT, TRANSLUCENT SUBSTRATE, AND METHOD FOR MANUFACTURING ORGANIC LED ELEMENT

(71) Applicant: Asahi Glass Company, Limited, Chiyoda-ku, Tokyo (JP)

(72) Inventor: Nobuhiro Nakamura, Tokyo (JP)

(73) Assignee: ASAHI GLASS COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/460,770

(22) Filed: Aug. 15, 2014

(65) Prior Publication Data
US 2014/0353656 A1    Dec. 4, 2014

Related U.S. Application Data

(60) Division of application No. 13/645,851, filed on Oct. 5, 2012, now Pat. No. 8,835,960, which is a continuation of application No. PCT/JP2011/058853, filed on Apr. 7, 2011.

(30) Foreign Application Priority Data

Apr. 8, 2010 (JP) ................................ 2010-089596

(51) Int. Cl.
*H01L 51/52* (2006.01)
*H05B 33/28* (2006.01)
(Continued)

(52) U.S. Cl.
CPC .............. *H01L 51/5268* (2013.01); *C03C 3/21* (2013.01); *C03C 8/08* (2013.01); *C03C 8/16* (2013.01); *H05B 33/28* (2013.01)

(58) Field of Classification Search
CPC ..... H01L 33/62; H01L 33/405; H01L 51/5268; H01L 33/58
USPC ...................... 257/98, 99, 100, 184, E33.056, 257/E33.058, E33.059, E33.067, E33.074, 257/E33.072, E33.073
See application file for complete search history.

(56) References Cited

U.S. PATENT DOCUMENTS

| 4,500,365 A | 2/1985 | Mori |
| 6,704,077 B1 | 3/2004 | Yoshida et al. |

(Continued)

FOREIGN PATENT DOCUMENTS

| CN | 1685767 A | 10/2005 |
| CN | 101647316 A | 2/2010 |

(Continued)

OTHER PUBLICATIONS

Definition of "Contact", Merriam Webster Dictionary Online, http://www.merriam-webster.com (2015).*

(Continued)

*Primary Examiner* — Michele Fan
(74) *Attorney, Agent, or Firm* — Foley & Lardner LLP

(57) ABSTRACT

The present invention provides an organic LED element having the significantly larger light emission area than conventional ones. The invention relates to an organic LED element, comprising: a transparent substrate; a light scattering layer; a transparent first electrode; an organic light-emitting layer; and a second electrode formed in this order, wherein the light scattering layer has a base material comprising a glass, and a plurality of scattering materials dispersed in the base material; the light scattering layer has side surfaces, and each of the side surfaces has a surface tilted at an angle larger than right angle from an upper surface on the first electrode side toward a bottom surface on the transparent substrate side; and the first electrode is placed so as to continuously cover the side surfaces.

7 Claims, 9 Drawing Sheets

(51) Int. Cl.
*C03C 3/21* (2006.01)
*C03C 8/08* (2006.01)
*C03C 8/16* (2006.01)

(56) References Cited

U.S. PATENT DOCUMENTS

| | | | |
|---|---|---|---|
| 7,531,957 B2 | 5/2009 | Sakamoto | |
| 8,018,140 B2 | 9/2011 | Nakamura et al. | |
| 8,283,845 B2* | 10/2012 | Itou et al. | 313/116 |
| 8,427,045 B2 | 4/2013 | Nakamura et al. | |
| 8,431,943 B2 | 4/2013 | Nakamura et al. | |
| 2004/0160165 A1 | 8/2004 | Yamauchi | |
| 2004/0253427 A1* | 12/2004 | Yokogawa et al. | 428/212 |
| 2005/0008894 A1* | 1/2005 | Hiruma et al. | 428/690 |
| 2005/0280352 A1 | 12/2005 | Lai | |
| 2006/0006408 A1 | 1/2006 | Suehiro et al. | |
| 2006/0125387 A1 | 6/2006 | Adachi et al. | |
| 2006/0137735 A1 | 6/2006 | Kobayashi et al. | |
| 2007/0036955 A1 | 2/2007 | Hiruma et al. | |
| 2007/0080627 A1 | 4/2007 | Sakamoto | |
| 2007/0210321 A1 | 9/2007 | Satou | |
| 2007/0267966 A1* | 11/2007 | Numajiri et al. | 313/502 |
| 2008/0093978 A1 | 4/2008 | Mori | |
| 2008/0211393 A1* | 9/2008 | Yaegashi | 313/504 |
| 2009/0153972 A1* | 6/2009 | Nakamura et al. | 359/599 |
| 2010/0060142 A1* | 3/2010 | Itou | B82Y 20/00 313/498 |
| 2010/0230667 A1 | 9/2010 | Nakamura et al. | |
| 2011/0140151 A1 | 6/2011 | Lee et al. | |
| 2011/0210370 A1* | 9/2011 | Kamamori et al. | 257/99 |
| 2011/0260953 A1 | 10/2011 | Lin et al. | |
| 2011/0284907 A1 | 11/2011 | Nakamura et al. | |
| 2011/0303938 A1 | 12/2011 | Uemura et al. | |

FOREIGN PATENT DOCUMENTS

| | | |
|---|---|---|
| JP | 11-329718 | 11/1999 |
| JP | 2005-063704 | 3/2005 |
| JP | 2005-108678 A | 4/2005 |
| JP | 2007-242286 A | 9/2007 |
| JP | 2008-010245 | 1/2008 |
| JP | 2010-033780 | 2/2010 |
| TW | 200511882 A | 3/2005 |
| TW | 200608828 A | 3/2006 |
| TW | 200911011 A | 3/2009 |
| TW | 200930677 A | 7/2009 |
| WO | WO-2010/032596 A1 | 3/2010 |

OTHER PUBLICATIONS

International Search Report mailed Jul. 12, 2011 in corresponding International Application No. PCT/JP2011/058853.

European Search Report issued in European Application No. 11765997.9 on Jun. 29, 2016.

\* cited by examiner

ORGANIC LED ELEMENT, TRANSLUCENT SUBSTRATE, AND METHOD FOR MANUFACTURING ORGANIC LED ELEMENT

CROSS-REFERENCE TO RELATED APPLICATIONS

This application is a Divisional of U.S. application Ser. No. 13/645,851, filed Oct. 5, 2012, which is a continuation of International Patent Application PCT/JP2011/058853, filed Apr. 7, 2011 which claims priority to Japanese Patent Application 2010-089596, filed Apr. 8, 2010 the disclosures of which are hereby incorporated by reference in their entirety.

TECHNICAL FIELD

The present invention relates to an organic LED element, a translucent substrate, and a method for manufacturing the organic LED element.

BACKGROUND ART

An organic LED (Light Emitting Diode) element has been widely used for displays, backlights, lighting applications, and the like.

A common organic LED element has a first electrode (anode) placed on a substrate, a second electrode (cathode) and an organic layer placed between the electrodes. When a voltage is applied between the electrodes, holes and electrons are injected from respective electrodes to the organic layer. When the holes and the electrons are recombined in the organic layer, binding energy is generated and an organic light-emitting material in the organic layer is excited by the binding energy. Since light is emitted at the time when the excited light-emitting material is returned to a ground state, a light emitting (LED) element is obtained by utilizing the light emission.

Usually, for the first electrode, i.e., anode, a transparent thin film such as ITO (Indium Tin Oxide) is used and, for the second electrode, i.e., cathode, a metal thin film such as aluminum or silver is used.

Recently, it has been proposed to place a resin-made light scattering layer having scattering materials between an ITO electrode and a substrate (for example, Patent Document 1). In such a constitution, since a part of emitted light generated in the organic layer is scattered by the scattering materials in the light scattering layer, a quantity of light confined in the ITO electrode and substrate (a quantity of totally reflected light) decreases and thus a light extraction efficiency of the organic LED element can be enhanced.

BACKGROUND ART DOCUMENTS

Patent Documents

Patent Document 1: JP-A-2005-63704
Patent Document 2: JP-A-11-329718

SUMMARY OF THE INVENTION

Problems that the Invention is to Solve

However, in the case where the light scattering layer is composed of a resin, there is a problem that it is extremely difficult to place another layer continuously with an even thickness on the upper surface or side surfaces of the light scattering layer. The following will specifically describe the problem.

In Patent Document 1, as shown in FIG. 4 of the document, since the constitution of the invention is disclosed by a partial cross-sectional view, respective positional relationship among the substrate, the light scattering layer and the transparent electrode is not clear. However, in general, an organic LED element frequently has a constitution as shown in FIG. 4 of Patent Document 2. Therefore, when the light scattering layer of Patent Document 1 is applied to Patent Document 2, the light scattering layer is placed between the anode 12 and the glass substrate 11 in FIG. 4 of Patent Document 2.

Here, as shown in FIG. 4 of Patent Document 2, since an EL element 13 is continuously formed from on the glass substrate 11 to on the anode 12, a stepped part is present. In the constitution in FIG. 4 of Patent Document 2, a height difference at the stepped part corresponds to the thickness of the anode 12.

However, in the case where a light scattering layer is placed between the glass substrate 11 and the anode 12, the height difference at the stepped part increases from the thickness of the anode 12 to the thickness of the anode 12 and the thickness of the light scattering layer, so that the difference becomes larger. Moreover, in general, the side surfaces of the layer composed of a resin is almost perpendicular to the upper surface thereof in many cases.

In such a state, it becomes extremely difficult to form the EL element 13 at the stepped part or, even if the EL element 13 is formed at the stepped part, there may arise a problem that the EL element 13 cannot have desired states (for example, thickness, evenness, adhesiveness).

Moreover, the aforementioned problem may occur also at the anode 12.

Specifically, in the case of the constitution in FIG. 4 of Patent Document 2, no stepped part is present between the anode 12 and the glass substrate 11. However, in the case where a light scattering layer is provided between the glass substrate 11 and the θanode 12, a stepped part corresponding to the thickness of the light scattering layer would be formed between the glass substrate 11 and the anode 12. Moreover, as mentioned above, the side surfaces of the light scattering layer composed of a resin is almost perpendicular to the upper surface thereof in many cases.

In such a state, it becomes extremely difficult to form the anode 12 at the stepped part or, even if the anode 12 is formed at the stepped part, there may arise a problem that the anode 12 cannot have desired states (for example, thickness, evenness, adhesiveness). Furthermore, in this case, since the thickness of the anode 12 becomes locally small and an electric current converges thereon, there is a possibility that the anode 12 is deteriorated and further broken.

Moreover, the resin-made light scattering layer is prone to undergo thermal contraction and, if the whole light scattering layer can be covered with a thin film of the anode 12, by such a constitution, there is a high possibility that exfoliation and cracks are generated at the anode 12, especially in the vicinity of the light scattering layer during the thermal contraction of the light scattering layer. When such exfoliation and cracks are generated at the anode 12, there is a problem that the organic LED element cannot perform a proper light-emitting action.

The present invention has been made under these circumstances, and an object of the invention is to provide a highly reliable organic LED element as compared with conventional ones.

Means for Solving the Problems

The invention provides the following organic LED element, translucent substrate and method for manufacturing the organic LED element.

(1) An organic LED element, comprising: a transparent substrate; a light scattering layer formed on the transparent substrate; a transparent first electrode formed on the light scattering layer; an organic light-emitting layer formed on the first electrode; and a second electrode formed on the organic light-emitting layer, wherein the light scattering layer has a base material comprising a glass, and a plurality of scattering materials dispersed in the base material, the light scattering layer has a bottom surface on the transparent substrate side, an upper surface on the first electrode side and side surfaces, and each of the side surfaces of the light scattering layer has a surface tilted at an angle larger than right angle from the upper surface toward the bottom surface, and the first electrode is placed so as to continuously cover the side surfaces of the light scattering layer.

(2) The organic LED element according to (1), further comprising a first electrode terminal and a second electrode terminal, wherein the first electrode terminal is constituted by a first barrier layer placed on the transparent substrate and a first conductive layer placed on the first barrier layer and electrically connected to the first electrode, and the second electrode terminal is constituted by a second barrier layer placed on the transparent substrate and a second conductive layer placed on the second barrier layer and electrically connected to the second electrode.

(3) The organic LED element according to (2), wherein the first barrier layer is constituted by the light scattering layer and/or the second barrier layer is constituted by the light scattering layer.

(4) The organic LED element according to (2) or (3), wherein the first conductive layer is constituted by the same material as that of the first electrode and/or the second conductive layer is constituted by the same material as that of the first electrode.

(5) The organic LED element according to any one of (1) to (4), wherein the scattering material is an air bubble and/or a precipitated crystal of the glass constituting the base material.

(6) The organic LED element according to any one of (1) to (5), wherein a content of the scattering material in the light scattering layer is 1 vol % or more.

(7) The organic LED element according to any one of (1) to (6), wherein the first electrode has a thickness ranging from 50 nm to 1.0 µm.

(8) The organic LED element according to any one of (1) to (7), wherein the light scattering layer has a thickness ranging from 5 µm to 50 µm.

(9) A translucent substrate, comprising: a transparent substrate; a light scattering layer formed on the transparent substrate; and a transparent electrode formed on the light scattering layer, wherein the light scattering layer has a base material comprising a glass, and a plurality of scattering materials dispersed in the base material, the light scattering layer has a bottom surface on the transparent substrate side, an upper surface on the transparent electrode side and side surfaces, and each of the side surfaces of the light scattering layer has a surface tilted at an angle larger than right angle from the upper surface toward the bottom surface, and the transparent electrode is placed so as to continuously cover the side surfaces of the light scattering layer.

(10) The translucent substrate according to (9), wherein the scattering material is an air bubble and/or a precipitated crystal of the glass constituting the base material.

(11) A method for manufacturing an organic LED element comprising a transparent electrode, a light scattering layer, a first electrode, an organic light-emitting layer and a second electrode, the method comprising:

(a) a step of forming the light scattering layer on the transparent substrate, wherein the light scattering layer has a base material comprising a glass, and a plurality of scattering materials dispersed in the base material; and the light scattering layer has a bottom surface on the transparent substrate side, an upper surface and side surfaces, and each of the side surfaces of the light scattering layer has a surface tilted at an angle larger than right angle from the upper surface toward the bottom surface, (b) a step of placing the transparent first electrode on the light scattering layer, wherein the first electrode is placed so as to continuously cover the side surfaces of the light scattering layer, (c) a step of placing the organic light-emitting layer on the first electrode, and (d) a step of placing the second electrode on the organic light-emitting layer.

(12) The method for manufacturing an organic LED element according to (11), wherein the step (a) comprises:

(a1) a step of placing a paste containing a glass powder on the transparent substrate, and (a2) a step of firing the transparent substrate on which the paste has been placed in a temperature range of a softening temperature of the glass powder±30° C., thereby forming the base material and a plurality of the scattering materials dispersed in the base material.

(13) An organic LED element, comprising a transparent substrate, a light scattering layer, a first electrode, an organic light-emitting layer, a second electrode and a sealing substrate, wherein the transparent substrate has a first region, a second region and a third region above an upper surface thereof, the second region is adjacent to the first region, and the first region is adjacent to the third region, the light scattering layer has a base material comprising a glass, and a plurality of scattering materials dispersed in the base material and is placed on the transparent substrate over the first region, the second region and the third region, the first electrode is placed on the light scattering layer so as to extend over the first region and the second region, the organic light-emitting layer is placed in the first region above the upper surface of the transparent substrate so as to come into contact with the first electrode and the light scattering layer, the second electrode is placed so as to extend over the first region and the third region so that the second electrode comes into contact with at least a part of the organic light-emitting layer and a part of the light scattering layer, and the sealing substrate is placed in the first region so as to cover the portion of the second electrode placed in the first region.

Advantage of the Invention

The present invention can provide a highly reliable organic LED element as compared with conventional ones.

MODE FOR CARRYING OUT THE INVENTION

The following will describe the present invention in detail with reference to Drawings.

Figure 1:
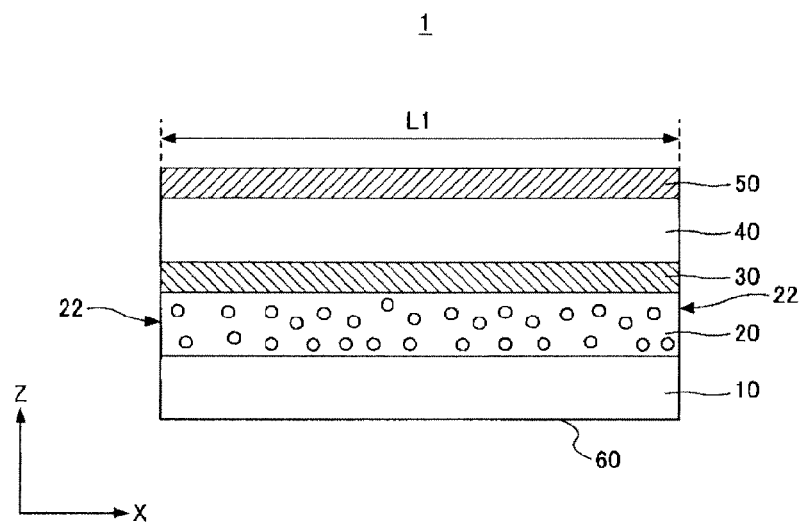
FIG. 1 is a schematic cross-sectional view of a conventional organic LED element.

First, for better understanding of the characteristic feature of the invention, a constitution of a conventional organic LED element, such as the organic LED element described in Patent Document 1, is briefly explained using FIG. 1.

FIG. 1 shows a schematic cross-sectional view of a conventional organic LED element.

As shown in FIG. 1, the conventional organic LED element 1 is constituted by laminating a transparent substrate 10, a light scattering layer 20, a transparent electrode (anode) 30, an organic light-emitting layer 40, and a counter electrode (cathode) 50 in the order. In the example of FIG. 1, a surface on the lower side of the organic LED element 1 (i.e., an exposed surface of the transparent substrate 10) becomes a light extraction surface 60. The organic light-emitting layer 40 is constituted by a plurality of layers, such as an electron transporting layer, an electron injection layer, a hole transporting layer, and a hole injection layer in addition to a light-emitting layer. Since such a constitution of the organic light-emitting layer 40 is well known by those skilled in the art, no further explanation will be described here.

The light scattering layer 20 has a characteristic of scattering an incident light in multiple directions. For example, the light scattering layer 20 is constituted by dispersing, into a matrix of a transparent material such as a resin, scattering materials (for example, air bubbles, particles, etc.) having a refractive index different from that of the transparent material. The particle diameter of the scattering material reaches about 10 μm at maximum and hence the light scattering layer 20 has a thickness of the order of at least around 20 μm to 30 μm.

The light scattering layer 20 scatters the incident light and can reduce reflection of the light at the interface with an adjacent layer of the light scattering layer 20. Therefore, a quantity of the light to be totally reflected in the organic LED element 1 decreases. Accordingly, in the organic LED element 1 having the constitution of FIG. 1, the quantity of the light exiting from the light extraction surface 60 can be enhanced as compared with the constitution having no light scattering layer 20.

In the organic LED element 1 of FIG. 1, the light emission area of the element is determined by the width L1 in an X direction of the organic light-emitting layer 40. Moreover, in order to increase the light emission area of the element 1, it becomes necessary to cover the whole including the side surfaces 22 of the light scattering layer 20 with the transparent electrode 30 so as to expand the effective light emission region of the organic light-emitting layer 40 in the X direction and further, place the organic light-emitting layer 40 so as to cover the whole of the transparent electrode 30.

However, since the light scattering layer 20 is constituted by a relatively thick resin layer as mentioned above, it is extremely difficult to cover the whole of the light scattering layer 20 including the side surfaces 22 of the light scattering layer 20 with a thin film such as the transparent electrode 30 having a thickness of about 100 nm at most. For example, in the case of a common film formation method such as a sputtering method, it is impossible to place the transparent electrode 30 continuously on the side surfaces 22 of the light scattering layer 20.

Moreover, a resin has a property that thermal contraction is relatively prone to occur. Therefore, in the case where the light scattering layer 20 is composed of a resin, even if the whole of the light scattering layer 20 can be covered with the transparent electrode 30, there is an extremely high possibility that exfoliation or cracks is generated at the transparent electrode 30 in the vicinity of the side surfaces 22 of the light scattering layer 20 during the thermal contraction of the light scattering layer 20. Moreover, when such exfoliation or cracks is generated at the transparent electrode 30, there is a problem that the organic LED element 1 cannot perform a proper light-emitting action.

As above, the conventional organic LED element 1 has a constitution that it is difficult to increase the light emission area of the element.

On the other hand, in the invention, there is provided an organic LED element including a transparent substrate, a light scattering layer formed on the transparent substrate, a transparent first electrode formed on the light scattering layer, an organic light-emitting layer formed on the first electrode and a second electrode formed on the organic light-emitting layer, wherein the light scattering layer has abase material composed of a glass and a plurality of scattering materials dispersed in the base material, the light scattering layer has a bottom surface on the transparent substrate side, an upper surface on the first electrode side and side surfaces, and each of the side surfaces of the light scattering layer has a surface tilted at an angle larger than right angle from the upper surface toward the bottom surface, and the first electrode is placed so as to continuously cover the side surfaces of the light scattering layer.

In such an organic LED element, since each of the side surfaces of the light scattering layer has a gentle slope, even when the first electrode is a thin film, a continuous film can be formed on the side surfaces of the light scattering layer with the first electrode. Accordingly, in the organic LED element of the invention, it becomes possible to significantly increase the light emission area of the organic LED element.

Here, the fact that each of the side surfaces of the light scattering layer has a gentle slope means that a maximum value of the interior angle formed by a tangential line at each site of the side surfaces of the light scattering layer and a bottom surface thereof is less than 90°. The interior angle means an angle formed on the light scattering layer side among angles formed by the tangential line and the bottom surface.

(First Constitution)

Figure 2:
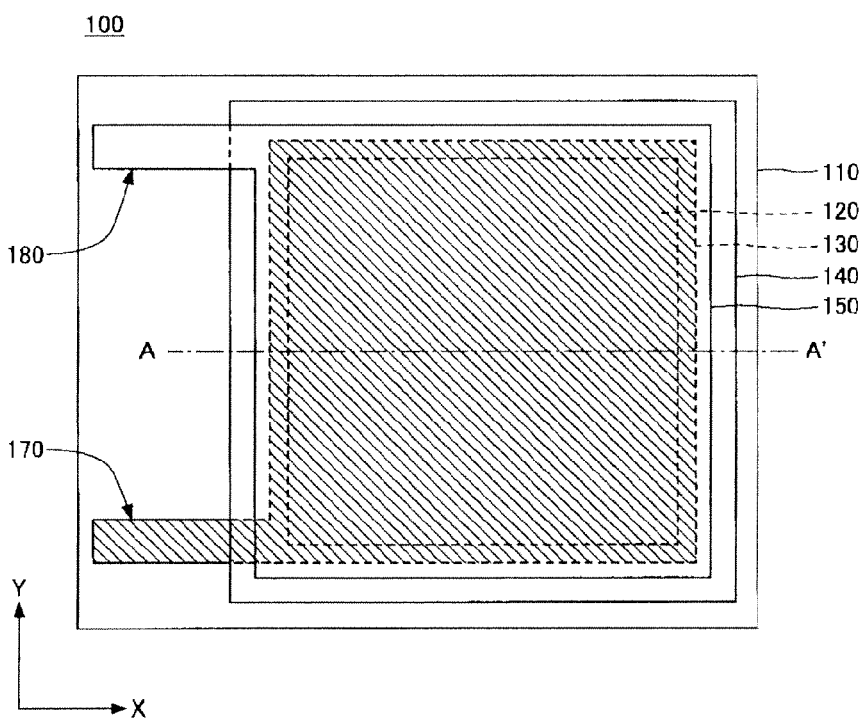
FIG. 2 is a schematic top view of one example of the organic LED element according to the invention.
Figure 3:
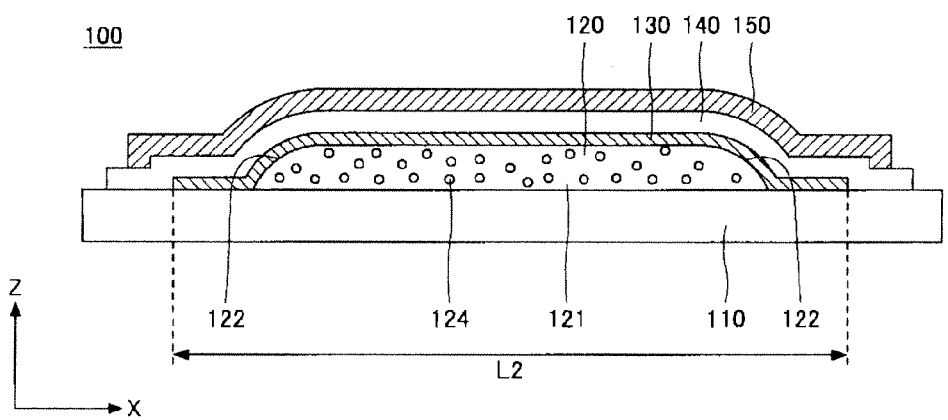
FIG. 3 is a schematic cross-sectional view of the organic LED element shown in FIG. 2.

The following will describe the constitution of the invention in further detail with reference to FIG. 2 and FIG. 3.

FIG. 2 schematically shows one example of a top view of the organic LED element according to the invention. Moreover, FIG. 3 schematically shows an A-A' cross-section of the organic LED element according to the invention shown in FIG. 2.

As shown in FIG. 2 and FIG. 3, an organic LED element 100 according to the invention is constituted by laminating a transparent substrate 110, a light scattering layer 120, a first electrode (anode) 130, an organic light-emitting layer 140, and a second electrode (cathode) 150 in the order.

As shown in FIG. 2, the first electrode 130 has an exposed part extending from a part of one side toward a horizontal direction (x direction) and the exposed part constitutes a first electrode terminal 170. The second electrode 150 has a part extending from a part of one side toward a horizontal direction (x direction) and the part constitutes a second electrode terminal 180.

The light scattering layer 120 is constituted by a glass-made base material 121 having a first refractive index and a plurality of scattering materials 124 which have a second refractive index different from that of the base material 121 and are dispersed in the base material 121. The thickness of the light scattering layer 120 ranges, for example, from 5 μm to 50 μm. In this regard, the thickness of the light scattering layer 120 means thickness at the most thick part of the light scattering layer.

The first electrode 130 is, for example, constituted by a transparent metal oxide thin film such as ITO (indium tin oxide) and the thickness is about 50 nm to 1.0 μm. On the other hand, the second electrode 150 is, for example, constituted by a metal such as aluminum or silver.

As shown in FIG. 3, the light scattering layer 120 has side surfaces 122. The side surface 122 is not a surface almost parallel to the Z direction but has a surface shape gently tilted along the X direction.

In the case of such a shape of the side surface 122, even when the first electrode 130 is a thin film, it becomes possible to cover the whole side surface 122 of the light scattering layer 120 with the first electrode 130. Therefore, it becomes possible to cover the whole of the light scattering layer 120 excluding the bottom surface with the first electrode 130.

Similarly, the whole of the first electrode 130 excluding the bottom surface and the first electrode terminal 170 is covered with the organic light-emitting layer 140. Moreover, each exposed part of the organic light-emitting layer 140 excluding the end faces is covered with the second electrode 150.

In such a constitution of the organic LED element 100, the width in the X direction, which contributes light emission, (i.e., width of the first electrode 130 covered with the organic light-emitting layer 140) is L2 and thus the light emission area can be significantly enhanced as compared with the conventional organic LED element as shown in FIG. 1 mentioned above.

In this regard, in the organic LED element 100 according to the invention, the side surfaces 122 of the light scattering layer 120 can be covered with the first electrode 130. Therefore, in the invention, there can be avoided or suppressed a problem that the light scattering layer 120 is eroded from the side surface 122 side with an etching agent in the step of patterning the first electrode 130.

Moreover, in the invention, there is obtained an additional feature that the rare materials constituting the light scattering layer 120 can be recycled after the organic LED element 100 is discarded.

For example, in the case where the first electrode 130 contains ITO and the light scattering layer 120 contains bismuth oxide ($Bi_2O_3$), indium and bismuth can be recovered by the following procedure.

First, the whole organic LED element 100 is immersed in a solvent such as an organic solvent. Thereby, the organic layer 140 is dissolved and, together with the dissolution, the second electrode 150 is exfoliated from the transparent substrate 110. However, since the whole of the light scattering layer 120 including the side surfaces 122 is covered with the first electrode 130, the layer remains unchanged during the treatment.

Next, when the first electrode 130 is dissolved with a strong acid, the light scattering layer 120 is also dissolved simultaneously. Thereafter, indium and bismuth can be recovered through displacement deposition or electrolytic refining.

(Second Constitution)

Figure 4:
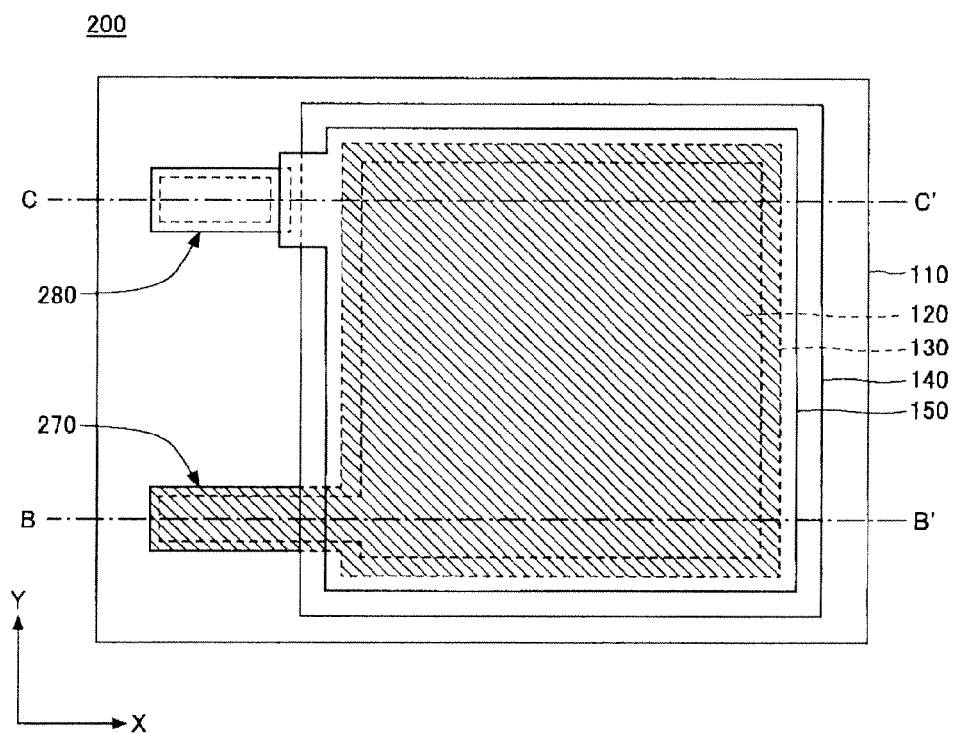
FIG. 4 is a schematic top view of another example of the organic LED element according to the invention.
Figure 5:
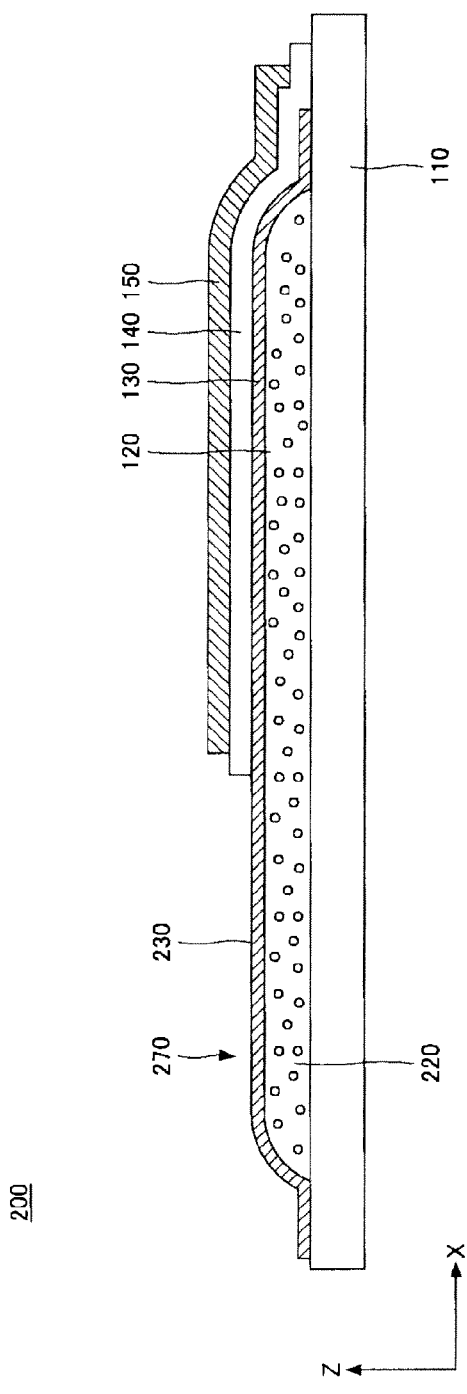
FIG. 5 is a schematic cross-sectional view along the B-B' line of the organic LED element shown in FIG. 4.
Figure 6:
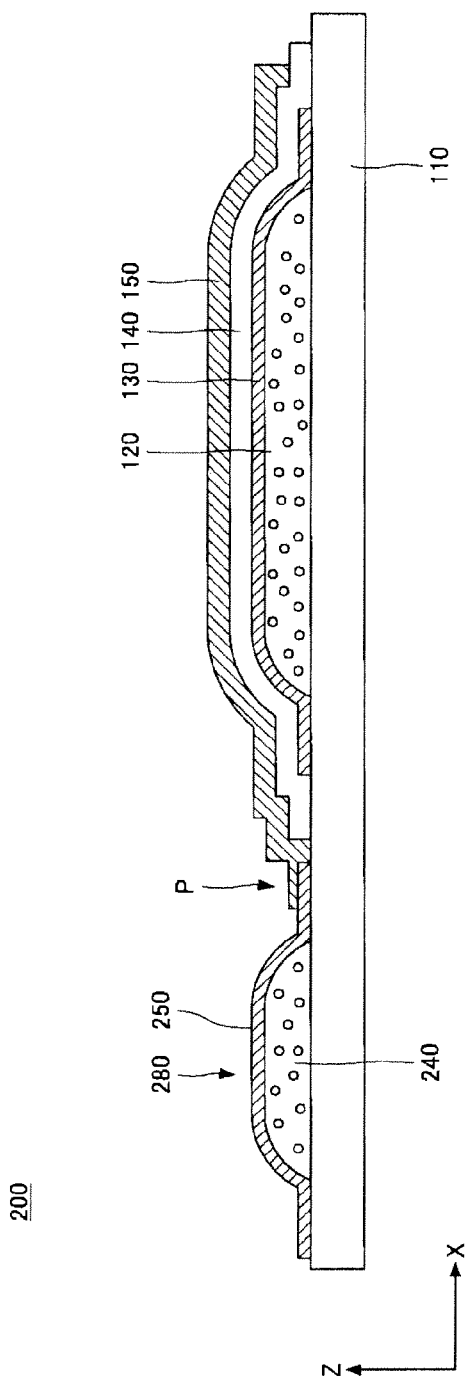
FIG. 6 is a schematic cross-sectional view along the C-C line of the organic LED element shown in FIG. 4.

The following will describe another constitution of the organic LED element according to the invention with reference to FIG. 4 to FIG. 6.

FIG. 4 schematically shows one example of a top view of another organic LED element according to the invention. Moreover, FIG. 5 schematically shows a B-B' cross-section of the organic LED element shown in FIG. 4. Furthermore, FIG. 6 schematically shows a C-C' cross-section of the organic LED element shown in FIG. 4.

As shown in FIG. 4 to FIG. 6, the organic LED element 200 has a constitution about the same as that of the aforementioned organic LED element 100. Therefore, in FIG. 4 to FIG. 6, the same reference numbers are used for the members the same as those in FIG. 2 and FIG. 3.

However, as clearly shown in FIG. 5 and FIG. 6, in the organic LED element 200, the structure of two electrode terminals is different from that of the aforementioned organic LED element 100.

Namely, the organic LED element 200 has a first electrode terminal 270 and the first electrode terminal 270 is constituted by a barrier layer 220 and a conductive layer 230 placed on the upper part of the barrier layer 220 as shown in FIG. 5. Moreover, the organic LED element 200 has a second electrode terminal 280 and the second electrode terminal 280 is constituted by a barrier layer 240 and a conductive layer 250 placed on the upper part of the barrier layer 240.

The conductive layer 230 of the first electrode terminal 270 is electrically connected to the first electrode 130. For example, in the example of FIG. 5, the conductive layer 230 is constituted by an extended part of the first electrode 130. Moreover, in the first electrode terminal 270, the barrier layer 220 may be the same layer as the light scattering layer 120.

Similarly, the conductive layer 250 of the second electrode terminal 280 is electrically connected to the second electrode 150. For example, in the example of FIG. 6, the conductive layer 250 is electrically connected to the second electrode 150 at the position P. The conductive layer 250 may be constituted by the same material as that of the first electrode 130. Also, the barrier layer 240 may be constituted by the same material as that of the light scattering layer 120.

The barrier layer 220 and the barrier layer 240 have a role of suppressing so-called migration of an alkali metal ion, which may occur during the action of the organic LED element.

The migration of an alkali metal ion means a phenomenon that, for example, in the organic LED element 100 shown in FIG. 2 and FIG. 3, an alkali metal ion contained in the transparent substrate 110 migrates to the sides of the first and second electrode terminals 170 and 180 when an electric current flows between the first electrode 130 and the second electrode 150 through the first and second electrode terminals 170 and 180. When such migration of the alkali metal ion occurs, an alkali metal salt precipitates at the interface between the transparent substrate 110 and the electrode terminals 170 and 180 and thereby there are cases where the electrode terminals 170 and 180 are deteriorated or broken.

However, in the organic LED element 200, since the first electrode terminal 270 has the barrier layer 220 between the conductive layer 230 and the transparent substrate 110, the migration phenomenon of the alkali metal ion as mentioned above is suppressed. Similarly, since the second electrode terminal 280 has the barrier layer 240 between the conductive layer 250 and the transparent substrate 110, the migration phenomenon of the alkali metal ion as mentioned above is suppressed.

Therefore, in the organic LED element 200, a stable light-emitting characteristic can be maintained over a long period of time.

(Third Constitution)

Figure 8:
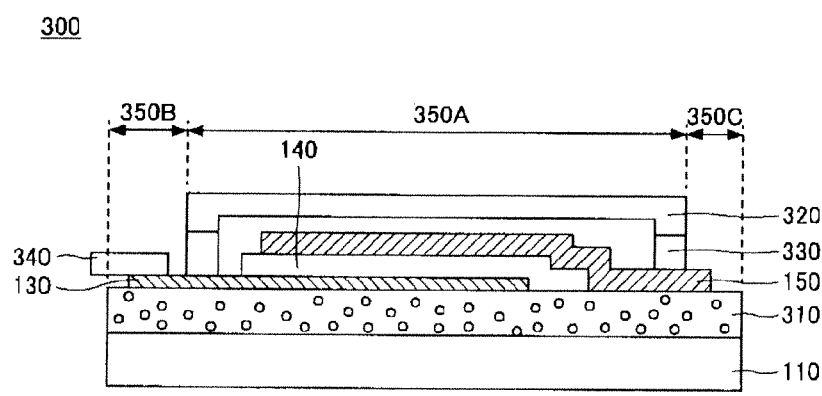
FIG. 8 is a conceptual cross-sectional view of the organic LED element according to the invention.

The following will describe still another constitution of the organic LED element according to the invention with reference to FIG. 8.

FIG. 8 schematically shows a cross-section of the still another organic LED element 300 according to the invention. In FIG. 8, the same reference numbers are used for the members the same as those in FIG. 2 to FIG. 5.

As shown in FIG. 8, the organic LED element 300 includes a transparent substrate 110, a light scattering layer 310, a first electrode (anode) 130, an organic light-emitting layer 140, a second electrode (cathode) 150, a sealing substrate 320, a resin seal 330, and a connection wiring 340.

The transparent substrate 110 of the organic LED element 300 has an upper surface having a first region 350A, a second region 350B and a third region 350C. As will be mentioned later, the first region 350A is positioned in the region where the organic light-emitting layer 140 is placed above the transparent substrate 110. Moreover, the second region 350B is positioned in the region where the organic light-emitting layer 140 and the second electrode 150 are not placed and at least a part of the first electrode 130 is placed above the transparent substrate 110. Furthermore, the third region 350C is positioned in the region where the organic light-emitting layer 140 and the first electrode 130 are not placed and at least a part of the second electrode 150 is placed above the transparent substrate 110.

In the case of the organic LED element 300, the light scattering layer 310 is formed on the upper surface of the transparent substrate 110 over the whole of the first region to the third region.

On the other hand, the first electrode 130 is placed on the light scattering layer 310 so as to extend over the first region (light emission region) 350A and the second region 350B.

Moreover, the organic light-emitting layer 140 is placed in the first region 350A above the transparent substrate 110 so as to come into contact with the first electrode 130 and the light scattering layer 310.

The second electrode 150 is placed so as to extend over the first region 350A and the third region 350C so that the second electrode comes into contact with a part of the organic light-emitting layer 140 and a part of the light scattering layer 310.

The sealing substrate 320 is placed in the first region 350A so that the sealing substrate surrounds the portion of the second electrode 150 placed in the first region 350A through a resin seal 330.

The connection wiring 340 is formed on the third region 350B so as to be electrically connected to the first electrode 130.

In such a constitution of the organic LED element 300, since the organic LED element includes a light scattering layer 310 extending over a wide range of the first region to the third region, a remarkable enhancement of the light extraction efficiency can be expected.

The following will describe details of the respective layers constituting the organic LED element according to the invention.

(Transparent Substrate 110)

The transparent substrate 110 is constituted by a material having a high transmittance for visible light. The transparent substrate 110 may be a glass substrate or a plastic substrate.

As a material for the glass substrate, an inorganic glass such as alkali glass, non-alkali glass or quartz glass may be mentioned. Furthermore, as a material for the plastic substrate, a polyester, a polycarbonate, a polyether, a polysulfone, a polyethersulfone, a polyvinyl alcohol or a fluorine-containing polymer such as polyvinylidene fluoride or polyvinyl fluoride may be mentioned.

The thickness of the transparent substrate 110 is not particularly limited and, for example, may range from 0.1 mm to 2.0 mm. When strength and weight are considered, the thickness of the transparent substrate 110 is preferably from 0.5 mm to 1.4 mm.

(Light Scattering Layer 120)

The light scattering layer 120 has a base material 121 and a plurality of scattering materials 124 dispersed in the base material 121. The base material 121 has a first refractive index, and the scattering material 124 has a second refractive index different from that of the base material.

The content of the scattering materials 124 in the light scattering layer 120 is preferably 1 vol % or more.

The amount of scattering materials 124 in the light scattering layer 120 preferably decreases from the inside to the outside of the light scattering layer 120. In this case, a high light extraction efficiency can be realized.

The base material 121 is composed of a glass and, as a material of the glass, an inorganic glass such as soda lime glass, borosilicate glass, non-alkali glass or quartz glass is used.

The scattering materials 124 are composed of air bubbles, precipitated crystals (precipitated crystals of the glass constituting the base material, etc.), particles of a material different from the base material, a phase-separated glass, or the like. The phase-separated glass means a glass composed of two or more kinds of glass phases. Of these, the scattering materials 124 are preferably air bubbles and/or precipitated crystals of the glass constituting the base material.

A larger difference between the refractive index of the base material 121 and the refractive index of the scattering materials 124 is better. For achieving the difference, it is preferred that a high refractive index glass is used as the base material 121 and air bubbles are used as the scattering materials 124.

For the high refractive index glass for the base material 121, one kind or two or more kinds of components of $P_2O_5$, $SiO_2$, $B_2O_3$, $GeO_2$ and $TeO_2$ may be selected as the network former, and one kind or two or more kinds of components of $TiO_2$, $Nb_2O_5$, $WO_3$, $Bi_2O_3$, $La_2O_3$, $Gd_2O_3$, $Y_2O_3$, $ZrO_2$, ZnO, BaO, PbO and $Sb_2O_3$ may be selected as the high refractive index component. Furthermore, in order to adjust the characteristics of the glass, an alkali oxide, an alkaline earth oxide, a fluoride or the like may be added within the range not affecting the refractive index.

Accordingly, examples of the glass type constituting the base material 121 include $B_2O_3$—ZnO—$La_2O_3$, $P_2O_5$—$B_2O_3$—$R'_2O_3$—R"O—$TiO_2$—$Nb_2O_5$—$WO_3$—$Bi_2O_3$, $TeO_2$—ZnO, $B_2O_3$—$Bi_2O_3$, $SiO_2$—ZnO, $B_2O_3$—ZnO, $P_2O_5$—ZnO, and the like. R' represents an alkali metal element and R" represents an alkaline earth metal element. The above material is merely examples, and the material to be used is not particularly limited as long as the constitution satisfies the above-described conditions.

The refractive index of the base material 121 is preferably equal to or higher than the refractive index of the first electrode 130. When the refractive index of the base material 121 is lower than the refractive index of the first electrode 130, there is a concern that loss by total reflection is generated at the interface between the light scattering layer 120 and the first electrode 130.

It is also possible to change the color tint of light emission by adding a colorant to the base material 121. As the colorant, a transition metal oxide, a rare earth metal oxide and a metal colloid can be used alone or in combination.

In the organic LED element 100 of the invention, a fluorescent material can be used in the base material 121 or the scattering materials 124. In this case, it becomes possible to perform wavelength conversion of light emission from the organic light-emitting layer 140 to thereby change the color tint. Moreover, in this case, the light emission colors of the organic LED element can be decreased and, since the emitted light exits after being scattered, the angle dependency of color tint and/or the change of color tint with time can be suppressed. Such a constitution is suitable for backlights and lighting applications where white light emission is necessary.

(First Electrode 130)

The first electrode 130 preferably has a translucency of 80% or more in order to extract the light generated in the organic light-emitting layer 140 to the outside. Furthermore, in order to inject many holes, the electrode preferably has a high work function.

For the first electrode 130, for example, materials such as ITO, $SnO_2$, ZnO, IZO (Indium Zinc Oxide), AZO (ZnO—$Al_2O_3$: a zinc oxide doped with aluminum), GZO (ZnO—$Ga_2O_3$: a zinc oxide doped with gallium), Nb-doped $TiO_2$ and Ta-doped $TiO_2$ are used.

The thickness of the first electrode 130 is preferably 50 nm (more preferably 100 nm) or more and 1.0 μm or less.

The refractive index of the first electrode 130 ranges, for example, from 1.9 to 2.2. For example, in the case where ITO is used as the first electrode 130, the refractive index of first electrode 130 can be decreased by increasing the carrier concentration. Although ITO available on the market contains, as a standard, 10 wt % of $SnO_2$, the refractive index of ITO can be decreased by further increasing the Sn concentration. However, the increase in the Sn concentration leads to an increase in the carrier concentration, but the mobility and transmittance are decreased. Therefore, the amount of Sn needs to be determined by the balance of the whole.

Moreover, the refractive index of the first electrode 130 is preferably determined with considering the refractive index of the base material 121 constituting the light scattering layer 120 and the refractive index of the second electrode 150. When waveguide calculation, the reflectance of the second electrode 150 and the like are considered, the difference between the first electrode 130 and the base material 121 is preferably 0.2 or less.

(Organic Light-Emitting Layer 140)

The organic light-emitting layer 140 is a layer having a light-emitting function and is constituted by a hole injection layer, a hole transport layer, a light-emitting layer, an electron transport layer and an electron injection layer in ordinary cases. However, it is obvious for those skilled in the art that the organic light-emitting layer 140 does not necessarily have all the layers as long as the layer has the light-emitting layer. The refractive index of the organic light-emitting layer 140 ranges from 1.7 to 1.8 in ordinary cases.

In order to reduce the barrier for hole injection from the first electrode 130, a hole injection layer preferably has a small difference in the ionization potential. When the charge injection efficiency from the electrode into the hole injection layer is enhanced, the driving voltage of the organic LED element 100 decreases and the charge injection efficiency increases.

As the material for the hole injection layer, a polymer material or a low-molecular material is used. As the polymer material, polystyrene sulfonic acid (PSS)-doped polyethylenedioxythiophene (PEDOT:PSS) is frequently used. Among low-molecular materials, a phthalocyanine-based material, copper phthalocyanine (CuPc) is widely used.

The hole transport layer plays a role of transporting a hole injected from the hole injection layer to the light-emitting layer. For the hole transport layer, a triphenylamine derivative, N,N'-bis(1-naphthyl)-N,N'-diphenyl-1,1'-biphenyl-4,4'-diamine (NPD), N,N'-diphenyl-N,N'-bis[N-phenyl-N-(2-naphthyl)-4'-aminobiphenyl-4-yl]-1,1'-biphenyl-4,4'-diamine (NPTE), 1,1-bis[(di-4-tolylamino)phenyl]cyclohexane (HTM2), N,N'-diphenyl-N,N'-bis(3-methylphenyl)-1,1'-diphenyl-4,4'-diamine (TPD), and the like are used.

The thickness of the hole transport layer ranges, for example, from 10 nm to 150 nm. As the thickness is smaller, the voltage of the organic LED element can be lowered, but in view of the problem of inter-electrode short circuit, the thickness ranges usually from 10 nm to 150 nm.

The light-emitting layer plays a role of providing a field for recombination of the injected electrons and holes. As the organic light-emitting material, a low-molecular or polymer one is used.

For the light-emitting layer, a metal complex of a quinoline derivative, such as tris(8-quinolinola(e)aluminum complex (Alq3), bis(8-hydroxy)quinaldine aluminum phenoxide (Alq'2OPh), bis(8-hydroxy)quinaldine aluminum-2,5-dimethylphenoxide (BAlq), mono(2,2,6,6-tetramethyl-3,5-heptanedionate)lithium complex (Liq), mono(8-quinolinolate) sodium complex (Naq), mono(2,2,6,6-tetramethyl-3,5-heptanedionate)lithium complex, mono(2,2,6,6-tetramethyl-3,5-heptanedionate)sodium complex and bis(8-quinolinolate)calcium complex (Caq2); and a fluorescent substance such as tetraphenylbutadiene, phenylquinacridone (QD), anthracene, perylene and coronene may be mentioned.

As the host material, a quinolinolate complex may be used and particularly, an aluminum complex having 8-quinolinol or a derivative thereof as a ligand may be used.

The electron transport layer plays a role of transporting an electron injected from the electrode. For the electron transport layer, for example, a quinolinol aluminum complex (Alq3), an oxadiazole derivative (e.g., 2,5-bis(1-naphthyl)-1, 3,4-oxadiazole (END), 2-(4-t-butylphenyl)-5-(4-biphenyl)-

1,3,4-oxadiazole (PBD), or the like), a triazole derivative, a bathophenanthroline derivative, a silole derivative, and the like are used.

The electron injection layer is, for example, constituted by providing a layer doped with an alkali metal such as lithium (Li) or cesium (Cs) at the interface with the second electrode 150.

(Second Electrode 150)

For the second electrode 150, a metal having a small work function or an alloy thereof is used. The second electrode 150 may be, for example, an alkali metal, an alkaline earth metal, and a metal of Group 3 in the Periodic Table. For the second electrode 150, for example, aluminum (Al), magnesium (Mg), an alloy thereof and the like are used.

Moreover, a co-deposition film of aluminum (Al) and magnesium-silver (MgAg) or a laminated electrode in which aluminum (Al) is deposited on a thin film of lithium fluoride (LiF) or lithium oxide ($Li_2O$) may be used. Furthermore, a laminate film of calcium (Ca) or barium (Ba) and aluminum (Al) may be used.

(Barrier Layers 220, 240)

For the barrier layers 220 and 240, materials the same as those in the case of the aforementioned light scattering layer 120 may be used without limitation thereto.

The thickness of each of the barrier layers 220 and 240 ranges, for example, from 0.5 μm to 50 μm.

(Method for Manufacturing Organic LED Element According to the Invention)

Figure 7:
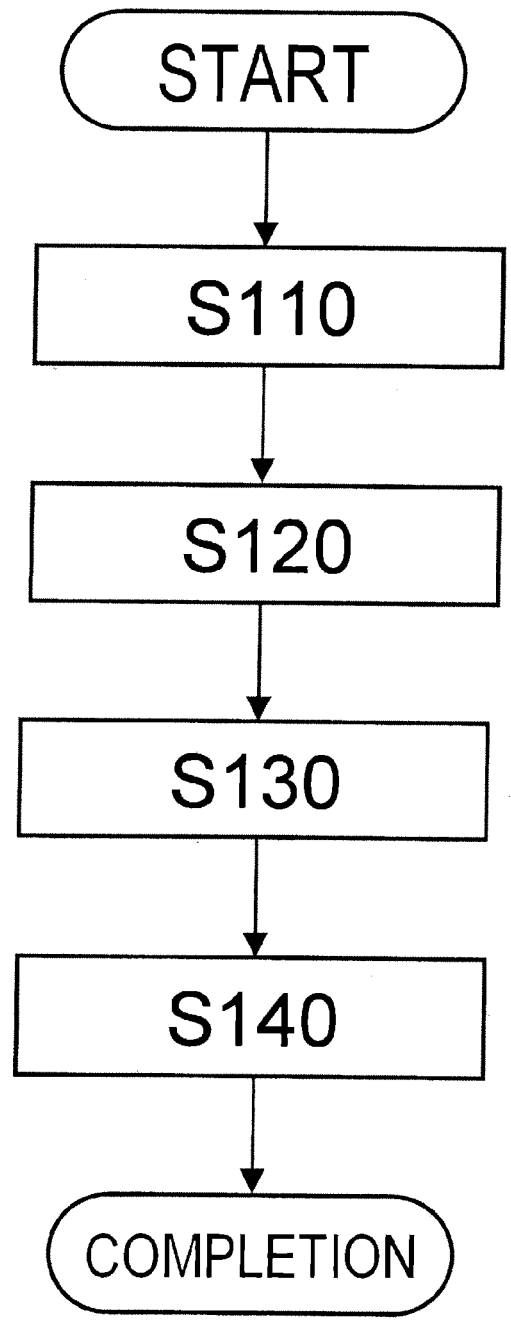
FIG. 7 is a flow chart schematically showing one example of the method for manufacturing the organic LED element according to the invention.

The following will describe one example of the method for manufacturing the organic LED element according to the invention with reference to FIG. 7. FIG. 7 shows a schematic flow chart when manufacturing the organic LED element according to the invention.

As shown in FIG. 7, the method for manufacturing the organic LED element according to the invention includes a step of forming a light scattering layer on a transparent substrate (step S110), a step of placing a transparent first electrode on the light scattering layer (step S120), a step of placing an organic light-emitting layer on the first electrode (step S130), and a step of placing a second electrode on the organic light-emitting layer (step S140). The following will describe respective steps in detail.

(Step S110)

First, a transparent substrate is prepared. As mentioned above, usually, a glass substrate or a plastic substrate is used as the transparent substrate.

Subsequently, a light scattering layer in which a scattering material is dispersed in a glass-made base material is formed on the transparent substrate. The method for forming the light scattering layer is not particularly limited but particularly, a method for forming the light scattering layer by a "frit paste method" is described here. However, it is obvious for those skilled in the art that the light scattering layer may be formed by the other method(s).

The frit paste method is a method of forming a desired glass-made film on the surface of a substrate to be placed by preparing a paste containing a glass material called a frit paste (preparation step), applying the frit paste on the surface of the substrate to be placed to form a pattern (pattern formation step), and further firing the frit paste (firing step). The following will describe respective steps briefly.

(Preparation Step)

First, a frit paste containing a glass powder, a resin and a solvent is prepared.

The glass powder is constituted by materials finally forming the base material of the light scattering layer. The composition of the glass powder is not particularly limited as long as a desired scattering characteristic is obtained and it is possible to form a frit paste and fire it. The composition of the glass powder may be one which contains from 20 to 30 mol % of $P_2O_5$, from 3 to 14 mol % of $B_2O_3$, from 10 to 20 mol % of $Bi_2O$, from 3 to 15 mol % of $TiO_2$, from 10 to 20 mol % of $Nb_2O_5$, and from 5 to 15 mol % of $WO_3$, and where the total amount of $Li_2O$, $Na_2O$ and $K_2O$ is from 10 to 20 mol % and the total amount of the above components is 90 mol % or more. The particle diameter of the glass powder ranges, for example, from 1 μm to 100 μm.

In order to control the thermal expansion characteristic of the finally obtained light scattering layer, a predetermined amount of a filler may be added to the glass powder. As the filler, for example, particles of zircon, silica or alumina are used and the particle diameter of the particles ranges, for example, from 0.1 μm to 20 μm.

As the resin, for example, ethyl cellulose, nitrocellulose, acrylic resin, vinyl acetate, butyral resin, melamine resin, alkyd resin, rosin resin and the like are used. As a base resin, ethyl cellulose and nitrocellulose may be used. When butyral resin, melamine resin, alkyd resin and rosin resin are added, the strength of a coated film of the frit paste is enhanced.

The solvent has a role of dissolving the resin and adjusting the viscosity. Examples of the solvent include ether-based solvents (butyl carbitol (BC), butyl carbitol acetate (BCA), diethylene glycol di-n-butyl ether, dipropylene glycol butyl ether, tripropylene glycol butyl ether, butyl cellosolve acetate), alcohol-based solvents (α-terpineol, pine oil, Dowanol), ester-based solvents (2,2,4-trimethyl-1,3-pentanediol monoisobutyrate) and phthalic acid ester-based solvents (DBP (dibutyl phthalate), DMP (dimethyl phthalate), DOP (dioctyl phthalate)). Mainly used are α-terpineol and 2,2,4-trimethyl-1,3-pentanediol monoisobutyrate. DBP (dibutyl phthalate), DMP (dimethyl phthalate) and DOP (dioctyl phthalate) also function as a plasticizer.

In addition, a surfactant may be added to the frit paste for adjusting the viscosity or promoting the frit dispersion. Moreover, a silane coupling agent may be used for surface modification.

Then, these raw materials are mixed to prepare a frit paste containing the glass raw materials homogeneously dispersed therein.

(Pattern Formation Step)

Next, the frit paste prepared by the aforementioned method is applied on the transparent substrate to form a pattern. The method for application and the method for pattern formation are not particularly limited. For example, the frit paste may be subjected to pattern printing on the transparent substrate using a screen printer. Alternatively, a doctor blade printing method or a die-coat printing method may be utilized.

Thereafter, the frit paste film is dried.

(Firing Step)

Then, the frit paste film is fired. Usually, firing is conducted in a two-stage step. In the first step, the resin in the frit paste film is decomposed to disappear and, in the second step, the glass powder is sintered and softened.

The first step is conducted under an air atmosphere with maintaining the frit paste film at a temperature range of 200° C. to 400° C. However, the treatment temperature varies depending on the material of the resin contained in the frit paste. For example, in the case where the resin is ethyl cellulose, the treatment temperature is from about 350° C. to about 470° C. and, in the case where the resin is nitrocellulose, the treatment temperature may be from about 200° C. to about 300° C. The treatment time is usually from 30 minutes to about 10 hours.

The second step is conducted under an air atmosphere with maintaining the frit paste film at a temperature range of the softening temperature of the contained glass powder±30° C. The treatment temperature is, for example, from about 450° C. to about 600° C. Moreover, the treatment time is not particularly limited and, for example, from 30 minutes to 1 hour.

After the second step, the glass powder is sintered and softened to form a base material of the light scattering layer. Moreover, with air bubbles present in the frit paste film, scattering materials homogeneously dispersed in the base material are obtained.

Thereafter, by cooling the transparent substrate, there is formed the light scattering layer whose side surface part has a surface tilted at an angle larger than right angle from the upper surface toward the bottom surface.

The thickness of the light scattering layer finally obtained may, for example, range from 5 μm to 50 μm.

(Step S120)

Then, a transparent first electrode (anode) is placed on the light scattering layer obtained in the above step. The first electrode is formed so as to continuously cover the side surfaces of the light scattering layer besides the upper part of the light scattering layer. As mentioned above, each of the side surfaces of the light scattering layer have a surface tilted at an angle larger than right angle from the upper surface toward the bottom surface. Therefore, even in the case where the thickness of the first electrode is small, a continuous layer of the first electrode can be easily placed on the side surfaces of the light scattering layer.

The method for placing the first electrode is not particularly limited and, for example, film formation methods such as a sputtering method, a deposition method, and a vapor-phase film formation method may be utilized. Moreover, the first electrode may be patterned.

As mentioned above, the material of the first electrode may be ITO or the like. Moreover, the thickness of the first electrode is not particularly limited and the thickness of the first electrode may, for example, range from 50 nm to 1.0 μm.

The laminate having the transparent substrate, the light scattering layer and the first electrode, which is obtained in the above steps is called a "translucent substrate". The specifications of the organic light-emitting layer to be placed in the following step diversely vary depending on use applications of the organic LED element to be finally obtained. Therefore, conventionally, the "translucent substrate" is distributed in the market without any modification as an intermediate product in many cases and thus the following steps are frequently omitted.

(Step S130)

In the case of manufacturing an organic LED element, an organic light-emitting layer is then placed so as to cover the first electrode. The method for placing the organic light-emitting layer is not particularly limited and, for example, a deposition method and/or a coating method may be used.

(Step S140)

Next, a second electrode is placed on the organic light-emitting layer. The method for placing the second electrode is not particularly limited and, for example, a deposition method, a sputtering method, a vapor-phase film formation method, and the like may be used.

By the above steps, the organic LED element 100 as shown in FIG. 2 and FIG. 3 is manufactured. It is obvious for those skilled in the art that the organic LED element 200 as shown in FIG. 4 to FIG. 6 can be also manufactured by similar methods.

Moreover, the aforementioned method for manufacturing the organic LED element is one example and it is obvious for those skilled in the art that the organic LED element may be manufactured by the other methods.

Examples

Manufacture of Glass Substrate with Scattering Layer

A substrate having a silica film of 40 nm formed on a soda lime substrate having a thickness of 0.55 mm and 50 mm square by a sputtering method was prepared. Then, a glass material for a scattering layer is prepared. A glass shown in Table 1 was blended and dissolved as a glass material for the scattering layer. Dissolution was performed at 1050° C. and, after standing at 950° C. for 30 minutes, the glass was cast onto a double roll to obtain flakes.

TABLE 1

| Material | (mol %) |
| --- | --- |
| $P_2O_5$ | 22.7 |
| $B_2O_3$ | 11.8 |
| $Li_2O$ | 5 |
| $Bi_2O_3$ | 14.9 |
| $Nb_2O_5$ | 15.7 |
| $WO_3$ | 9.3 |
| ZnO | 20.6 |

Figure 9:
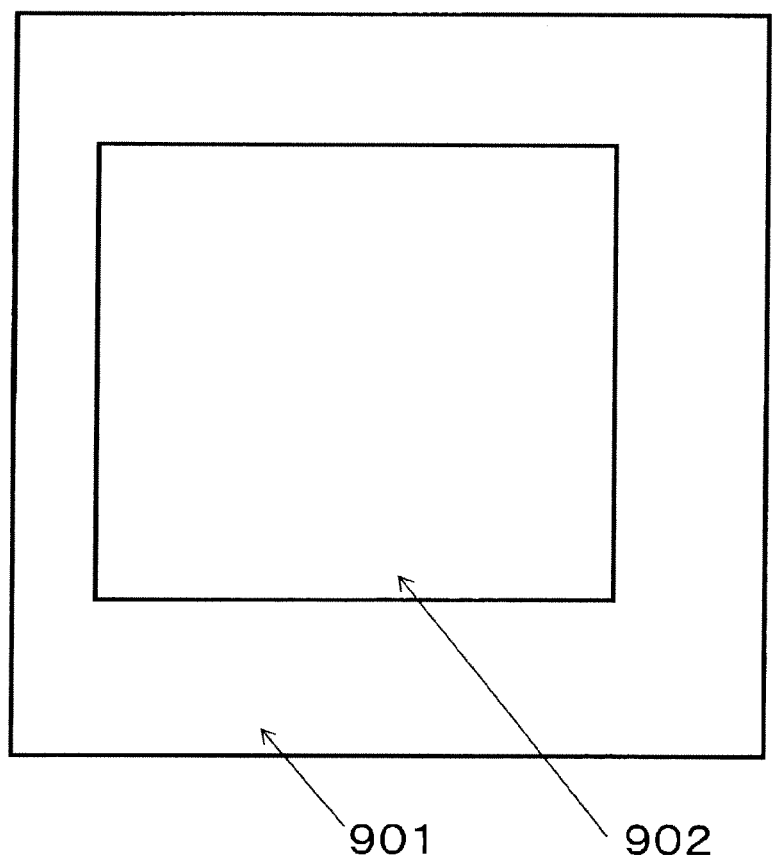
FIG. 9 is a top view showing a positional relationship between the glass substrate and the scattering layer.

This glass had a glass transition temperature of 475° C. and a thermal expansion coefficient of $72 \times 10^{-7}$ (1/° C.). Moreover, the refractive index nd at the d line (587.56 nm) was 1.98. The glass transition point was measured with a thermal analysis instrument (manufactured by Bruker, trade name: TD5000SA) by a thermal expansion method at a temperature rise rate of 5° C./min. The refractive index was measured by a refractometer (manufactured by Kalnew Optical Industrial Co., Ltd., trade name. KRP-2). Then, the aforementioned flakes were dry milled in a zirconia-made planetary ball mill for 2 hours to produce a glass powder having an average particle diameter (d50, particle size at an integrated value of 50%, unit: μm) of 1 to 3 μm. Subsequently, 75 g of the obtained glass powder was kneaded with 25 g of an organic vehicle (prepared by dissolving about 10 mass % of ethyl cellulose in α-terpineol or the like) to produce a paste ink (glass paste). This glass paste was printed using a screen printer to form a square pattern. After the screen printing, drying was performed at 120° C. for 10 minutes and then printing and drying were repeated. The substrate was heated up to 450° C. over 45 minutes, held at 450° C. for 10 hours, then heated up to 575° C. over 12 minutes, held at 575° C. for 40 minutes, and thereafter, cooled to room temperature over 3 hours, whereby a glass layer (scattering layer) 902 was formed on the glass substrate 901 as shown in FIG. 9. The scattering layer 902 had a film thickness of 42 μm. The total light transmittance and haze value of the scattering layer 902 formed on the glass substrate 901 were measured. As a measurement device, a haze meter HGM-2 manufactured by Suga Test Instruments Co., Ltd. was used. As a reference, the aforementioned soda line substrate was measured. As a result, the total light transmittance was 69% and the haze value was 73%. Moreover, surface waving was measured using SURF-COM 1400D manufactured by Tokyo Seimitsu Co., Ltd. The arithmetic average roughness (Ra) was 0.95 μm.

(Film Formation of ITO Layer)

Figure 10:
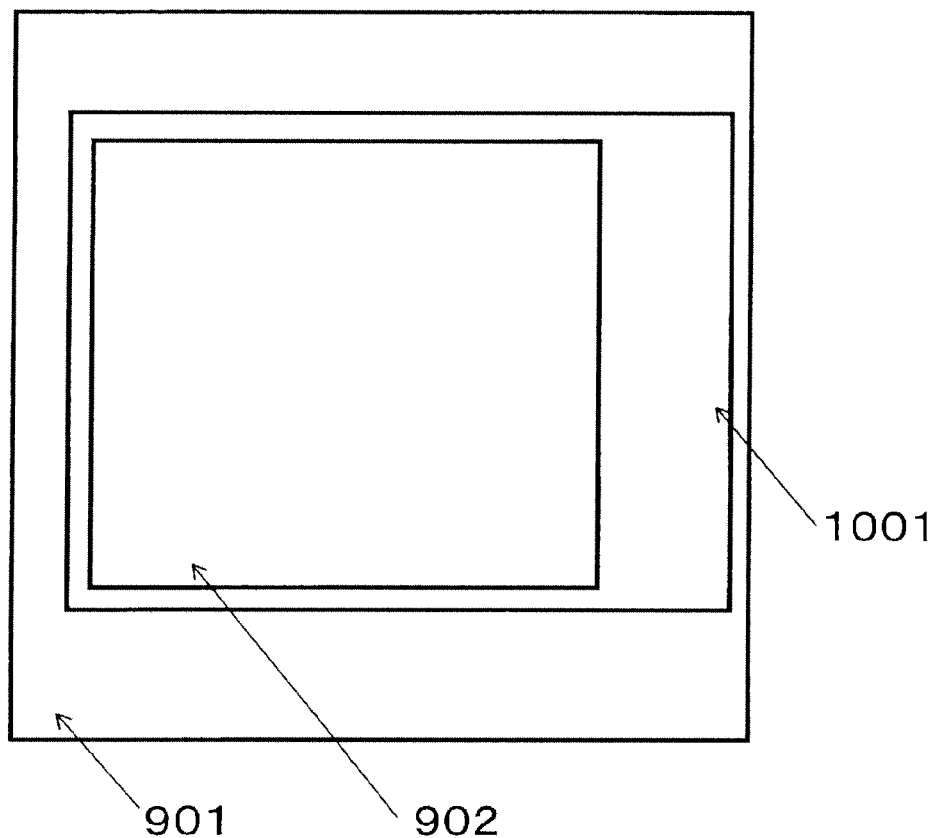
FIG. 10 is a top view showing a positional relationship between the glass substrate with a scattering layer and ITO.

An ITO target having a diameter of 6 inches was placed on each cathode of a batch-type magnetron sputtering device. Then, a metal-made mask was placed on the substrate holder of the sputtering device so as to obtain a rectangular ITO pattern 1001 having a length of one side of 3 cm as shown in FIG. 10 on the glass substrate with the scattering layer of FIG. 9. After the sputtering device was evacuated to $1 \times 10^{-3}$ Pa or less, a substrate-heating heater was set at 250° C. When the glass substrate with the scattering layer was heated, 98 sccm of argon gas and 2 sccm of oxygen gas were introduced as an atmospheric gas. By using the ITO target, an ITO layer 1001 having a film thickness of 150 nm was formed by DC pulse sputtering at an input electric power of 300 W. Thereafter, the substrate-heating heater was turned off, the sputtering device was opened to the air, and the glass substrate with the scattering layer on which film formation had been finished was taken out.

(Production of Organic EL Element)

Figure 11:
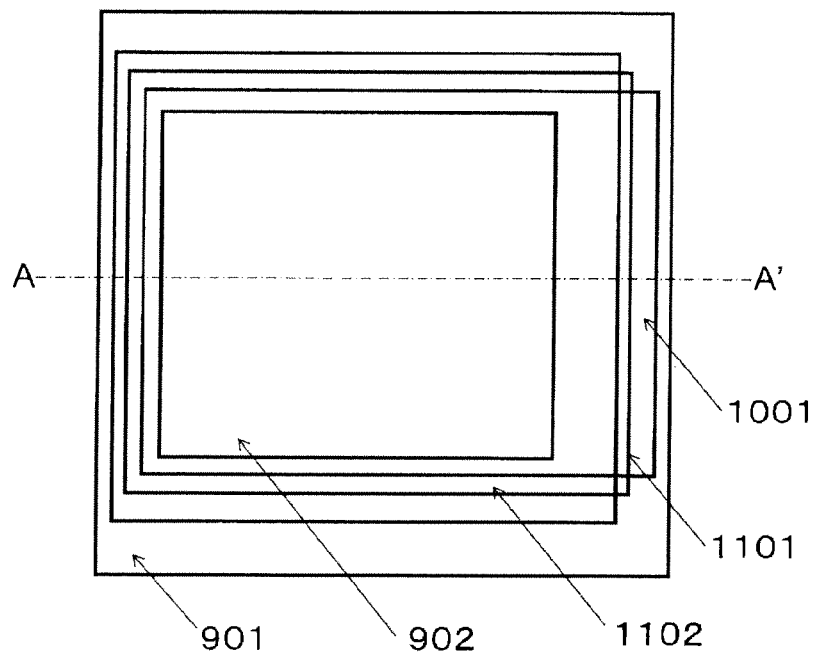
FIG. 11 is a top view showing a positional relationship between the glass substrate with a scattering layer on which an ITO pattern has been formed and the organic layer and the reflective electrode.

Using the aforementioned substrate, an organic EL element was produced. First, after ultrasonic cleaning using pure water and IPA was performed, oxygen plasma was applied to clean a surface thereof. Then, using a vacuum deposition apparatus, 100 nm of α-NPD (N,N-diphenyl-N,N'-bis(1-naphthyl)-1,1'-biphenyl-4,4"-diamine), 60 nm of Alq3 (tris8-hydroxyquinoline aluminum), 0.5 nm of LiF, and 80 nm of Al were continuously deposited. At this time, α-NPD, Alq3, LiF and Al were patterned using masks to obtain patterns shown in FIG. 11. FIG. 11 is a top view showing a positional relationship between the glass substrate with the scattering layer on which an ITO pattern has been formed and the organic layer and the reflective electrode. In FIG. 11, 1101 represents the organic layer and 1102 represents the reflective electrode. Thereafter, a substrate for sealing and the main substrate were attached with a UV-curable resin and UV irradiation was performed to adhere them, thereby obtaining an organic EL element.

The A-A' cross-section shape in FIG. 11 has the same shape as shown in FIG. 3 mentioned above.

(Confirmation of Light Emission State)

Figure 12:
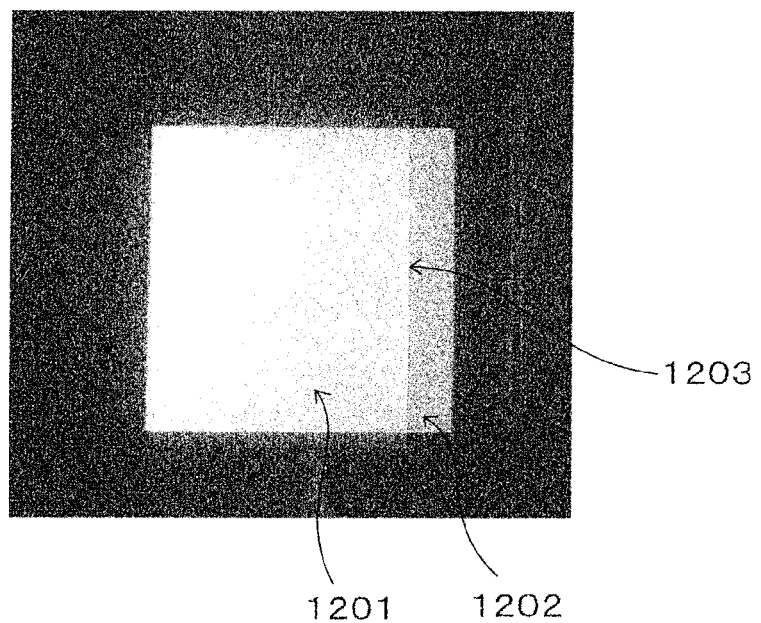
FIG. 12 is a photograph showing a state that light is emitted at the upper part 1201 of the scattering layer and the pattern edge part 1202 of the scattering layer.

A light emission state was confirmed by applying 5V to the produced organic EL panel. FIG. 12 is a photograph showing a state that light is emitted at the upper part 1201 of the scattering layer and the pattern edge part 1202 of the scattering layer. Thus, the element is formed of three regions of the upper part 1201 of the scattering layer, the pattern edge part 1202 of the scattering layer and the upper part 1203 of the glass substrate, but good light emission is confirmed in all the regions. At the upper part 1201 of the scattering layer, much light is extracted due to the scattering layer and it is revealed that the part is bright as compared with the upper part 1203 of the glass substrate. Moreover, at the edge part 1202 of the scattering layer, since the shape is gently sloping, good coverage of ITO, the organic film, LiF and Al was observed and it was confirmed that the element at the upper part 1201 of the scattering layer and the upper part 1203 of the glass substrate could be lightened with one pair of electrode pattern with no short circuit between ITO and the Al electrode and no generation of disconnection thereof.

While the invention has been described in detail and with reference to specific embodiments thereof, it will be apparent to one skilled in the art that various changes and modifications can be made therein without departing from the spirit and scope of the invention.

This application is based on Japanese Patent Application No. 2010-089596 filed on Apr. 8, 2010, the contents of which are incorporated herein by reference.

INDUSTRIAL APPLICABILITY

The present invention can be applied to an organic LED element to be used for a light-emitting device or the like.

DESCRIPTION OF REFERENCE NUMERALS AND SIGNS

1 Conventional organic LED element
10 Transparent substrate
20 Light scattering layer
22 Side surface
30 Transparent electrode (anode)
40 Organic light-emitting layer
50 Counter electrode (cathode)
60 Light extraction surface
100 Organic LED element according to the invention
110 Transparent substrate
120 Light scattering layer
121 Base material
122 Side surface
124 Scattering material
130 First electrode (anode)
140 Organic light-emitting layer
150 Second electrode (cathode)
170 First electrode terminal
180 Second electrode terminal
200 Another organic LED element
220 Barrier layer
230 Conductive layer
240 Barrier layer
250 Conductive layer
270 First electrode terminal
280 Second electrode terminal
300 Still another organic LED element
310 Light scattering layer
320 Sealing substrate
330 Resin seal
340 Connection wiring
350A, 350B, 350C Regions

What is claim is:

1. An organic LED element, comprising a transparent substrate, a light scattering layer, a first electrode, an organic light-emitting layer, a second electrode and a sealing substrate, wherein the transparent substrate has a first region, a second region and a third region above an upper surface thereof, the second region is adjacent to the first region, and the first region is adjacent to the third region, the light scattering layer has a base material comprising a glass, and a plurality of scattering materials dispersed in the base material and is placed on the transparent substrate over the first region, the second region and the third region, the first electrode is placed on the light scattering layer so as to extend over the first region and the second region, the organic light-emitting layer is placed in the first region above the upper surface of the transparent substrate so as to come into contact with the first electrode and the light scattering layer, the second electrode is placed so as to extend over the first region and the third region so that the second electrode comes into contact with at least a part of the organic light-emitting layer and a part of the light scattering layer, and the sealing substrate is placed in the first region so as to cover the portion of the second electrode placed in the first region, wherein the organic LED element further comprises a first electrode terminal and a second electrode terminal, wherein the first electrode terminal is constituted by a first barrier layer placed on the transparent substrate and a first conductive layer placed on the first barrier layer and electrically connected to the first electrode, and the second electrode terminal is constituted by a second barrier layer placed on the transparent substrate and a second conductive layer placed on the second barrier layer and electrically connected to the second electrode and wherein the first barrier layer is constituted by the light scattering layer and/or the second barrier layer is constituted by the light scattering layer.

2. The organic LED element according to claim 1, wherein the first conductive layer is constituted by the same material as that of the first electrode and/or the second conductive layer is constituted by the same material as that of the first electrode.

3. The organic LED element according to claim 1, wherein the scattering material is an air bubble and/or a precipitated crystal of the glass constituting the base material.

4. The organic LED element according to claim 1, wherein a content of the scattering material in the light scattering layer is 1 vol % or more.

5. The organic LED element according to claim 1, wherein the first electrode has a thickness ranging from 50 nm to 1.0 µm.

6. The organic LED element according to claim 1, wherein the light scattering layer has a thickness ranging from 5 µm to 50 µm.

7. The organic LED element according to claim 1, wherein the light scattering layer is extended over the outside of the sealing substrate.

* * * * *